United States Patent
Joy et al.

(10) Patent No.: US 12,057,322 B2
(45) Date of Patent: Aug. 6, 2024

(54) METHODS FOR ETCHING METAL FILMS USING PLASMA PROCESSING

(71) Applicants: Tokyo Electron Limited, Tokyo (JP); International Business Machines Corporation, Armonk, NY (US)

(72) Inventors: Nicholas Joy, Albany, NY (US); Devi Koty, Hopewell Junction, NY (US); Qingyun Yang, Hopewell Junction, NY (US); Nathan P. Marchack, Armonk, NY (US); Sebastian Ulrich Engelmann, Yorktown Heights, NY (US)

(73) Assignees: Tokyo Electron Limited, Tokyo (JP); International Business Machines Corporation, Armonk, NY (US)

( * ) Notice: Subject to any disclaimer, the term of this patent is extended or adjusted under 35 U.S.C. 154(b) by 482 days.

(21) Appl. No.: 16/658,620

(22) Filed: Oct. 21, 2019

(65) Prior Publication Data

US 2021/0118693 A1    Apr. 22, 2021

(51) Int. Cl.
*H01L 21/3213* (2006.01)
*H01L 21/02* (2006.01)
*H01L 21/67* (2006.01)
*H01L 21/768* (2006.01)

(52) U.S. Cl.
CPC .... *H01L 21/32136* (2013.01); *H01L 21/0223* (2013.01); *H01L 21/02247* (2013.01); *H01L 21/67207* (2013.01); *H01L 21/76805* (2013.01)

(58) Field of Classification Search
CPC .............................. C23F 1/12; H01L 21/32136
See application file for complete search history.

(56) References Cited

U.S. PATENT DOCUMENTS

| | | | |
|---|---|---|---|
| 6,541,380 B2 | 4/2003 | Ying et al. | |
| 2001/0006245 A1 | 7/2001 | Yunogami et al. | |
| 2002/0132437 A1* | 9/2002 | Tsou | H01L 29/42376 438/341 |
| 2003/0142458 A1* | 7/2003 | Joo | H01L 28/60 361/302 |
| 2004/0097046 A1* | 5/2004 | Maruyama | H01L 21/76229 438/294 |

(Continued)

FOREIGN PATENT DOCUMENTS

| | | |
|---|---|---|
| KR | 20080001254 A | 1/2008 |
| KR | 20090045529 A | 5/2009 |
| KR | 101547319 B1 | 8/2015 |

OTHER PUBLICATIONS

S. Wolf and R.N. Tauber, "Silicon Processing for the VLSI Era, vol. 1—Process Technology", Lattice Press, California, 1986, pp. 521-535.*

(Continued)

*Primary Examiner* — Thomas T Pham
(74) *Attorney, Agent, or Firm* — Slater Matsil, LLP

(57) ABSTRACT

A method of plasma processing that includes maintaining a plasma processing chamber between 10° C. to 200° C., flowing oxygen and nitrogen into the plasma processing chamber, where a ratio of a flow rate of the nitrogen to a flow rate of oxygen is between about 1:5 and about 1:1, and etching a ruthenium/osmium layer by sustaining a plasma in the plasma processing chamber.

12 Claims, 7 Drawing Sheets

(56) References Cited

U.S. PATENT DOCUMENTS

| | | | |
|---|---|---|---|
| 2006/0163640 A1* | 7/2006 | Park | H01L 23/5223 257/306 |
| 2012/0231561 A1* | 9/2012 | Dolan | H01L 21/02071 438/14 |
| 2015/0270140 A1* | 9/2015 | Gupta | H01L 21/32136 216/67 |
| 2018/0211870 A1 | 7/2018 | Chae et al. | |
| 2018/0374791 A1 | 12/2018 | Smith et al. | |
| 2019/0237331 A1 | 8/2019 | Lu et al. | |

OTHER PUBLICATIONS

Han et al., "Hydrogen Plasma Utilization in Advanced Logic Technology", Oct. 13, 2015.*

Fujimura, Shuzo, et al. "Additive Nitrogen Effects on Oxygen Plasma Downstream Ashing." Japanese Journal of Applied Physics, vol. 29, No. Part 1, No. 10, 1990, pp. 2165-2170., doi:10.1143/jap.29.2165.

Gupta, Anshul, et al. "High-Aspect-Ratio Ruthenium Lines for Buried Power Rail." 2018 IEEE International Interconnect Technology Conference (IITC), 2018, doi:10.1109/iitc.2018.8430415.

Kim, Jin Hong, et al. "Anisotropic Etching Characteristics of Platinum Electrode for Ferroelectric Capacitor." IEEE Transactions on Electron Devices, vol. 46, No. 5, 1999, pp. 984-992., doi:10.1109/16.760407.

Gall, Daniel. "Electron Mean Free Path in Elemental Metals." Journal of Applied Physics, vol. 119, No. 8, 2016, p. 085101., doi:10.1063/1.4942216.

Lee, Ho Jae, et al. "PECVD Chamber Cleaning End Point Detection (EPD) Using Optical Emission Spectroscopy Data." Transactions on Electrical and Electronic Materials, vol. 14, No. 5, 2013, pp. 254-257., doi:10.4313/teem.2013.14.5.254.

Lee, Eung-Jik, et al. "Reactive Ion Etching Mechanism of RuO2Thin Films in Oxygen Plasma with the Addition of CF4, Cl2, and N2." Japanese Journal of Applied Physics, vol. 37, No. Part 1, No. 5A, 1998, pp. 2634-2641., doi:10.1143/jap.37.2634.

Kiehlbaugh, Kasi Michelle. "Halogen-Based Plasma Etching of Novel Field-Effect Transistor Gate Materials." University of California, Berkeley, 2009.

Lee, Eung-Jik, et al. "The Effects of the Addition of CF4, Cl2, and N2 TO O2 ECR Plasma on the ETCH Rate, Selectivity and Etched Profile of RuO2 Film." MRS Proceedings, vol. 493, 1997, doi:10.1557/proc-493-183.

PCT International Search Report and Written Opinion of the International Searching Authority, PCT Application No. PCT/US2020/048691, dated Dec. 10, 2020, 11 pages.

* cited by examiner

METHODS FOR ETCHING METAL FILMS USING PLASMA PROCESSING

TECHNICAL FIELD

The present invention relates generally to plasma processing, and, in particular to plasma processes for etching metal films.

BACKGROUND

Generally, semiconductor devices used in electronics, such as mobile phones, digital cameras, and computers, are fabricated by sequentially depositing and patterning layers of dielectric, conductive, and semiconductor materials over a semiconductor substrate, using photolithography and etching to form structures that function as circuit components (e.g., transistors, resistors, and capacitors) and as interconnect elements (e.g., conductive lines, contacts and vias). Driven by a demand for low-cost electronics, the semiconductor industry has repeatedly reduced the minimum feature sizes in semiconductor devices to a few nanometers with innovations in lithography (e.g., immersion lithography and multiple patterning) to increase the packing density of components, thereby reducing the cost of integrated circuits (ICs). Further increase in density and reduction in cost is achieved using three-dimensional (3D) structures (e.g., the fin field-effect transistors (FinFET)) and, in some instances, stacking electronic components such as memory storage elements (e.g., the ferroelectric capacitor, the magnetic tunnel junction (MTJ), etc.) and precision passive components (e.g., the thin-film resistor (TFR) and the metal-insulator-metal (MIM) capacitor) in layers in between successive interconnect levels.

Plasma processing techniques, such as reactive ion etching (RIE), plasma-enhanced chemical vapor deposition (PECVD), plasma-enhanced atomic layer etch and deposition (PEALE and PEALD), sputter etch, physical vapor deposition (PVD), and cyclic etch-deposition (e.g., the Bosch etch process) have become indispensable in fabricating ICs. The diversity of materials used in IC fabrication such as semiconductors, insulators (including $SiO_2$, $Si_3N_4$, high-k gate dielectrics, and low-k dielectrics), magnetic and ferroelectric films, and metals for interconnect and electrodes makes developing plasma processes a challenge. Miniaturization to a few nanometers has intensified the challenge. The plasma processes are expected to deliver precise dimensions (e.g., linewidths, etch depth, and film thicknesses) in the nanometer range along with precisely controlled features, for example, conformality, anisotropy, selectivity, surface and line edge roughness, and edge profile, often at atomic scale dimensions, uniformly across a wide (e.g., 300 mm) wafer. Furthermore, introduction of unconventional materials (e.g., Co and Ru) at feature sizes below 20 nm may raise new issues in developing plasma etch and deposition processes compatible with conventional Si IC fabrication.

Overcoming the hurdles in providing plasma processing technology for manufacturing of scaled semiconductor devices is a challenge that requires further innovation.

SUMMARY

In accordance with an embodiment of the present invention, a method of plasma processing includes maintaining a plasma processing chamber between 10° C. to 200° C., flowing oxygen and nitrogen into the plasma processing chamber, where a ratio of a flow rate of the nitrogen to a flow rate of oxygen is between about 1:5 and about 1:1, and etching a ruthenium/osmium layer by sustaining a plasma in the plasma processing chamber.

In accordance with an embodiment of the present invention, a method of plasma processing includes flowing oxygen and nitrogen into a plasma processing chamber, sustaining a plasma in the plasma processing chamber, exposing a substrate disposed in the plasma processing chamber to the plasma, the substrate comprising a ruthenium/osmium layer, and forming a feature by etching, at a first rate, the ruthenium/osmium layer. A value of the first rate at a point at a center of the substrate to a value of the first rate at a point at an edge of the substrate varies between 0.85 to 1.15, and a surface roughness of the ruthenium/osmium layer after the etching varies between 0.1 nm and 1 nm.

In accordance with an embodiment of the present invention, a method of forming a device includes depositing an insulating layer over a substrate, the insulating layer including a major outer surface; forming an opening in the insulating layer; depositing a first conductive material including ruthenium/osmium, the first conductive material covering the major outer surface and covering sidewalls of the opening; and using a plasma etching process, removing the first conductive material from the major outer surface leaving a remaining portion covering a portion of the sidewalls, where using the plasma etching process includes flowing oxygen and nitrogen into a plasma processing chamber.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1:
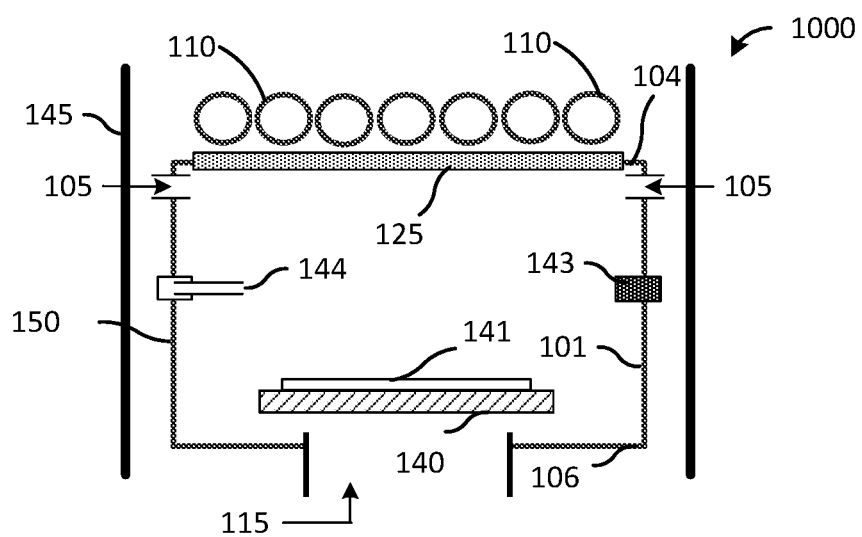
FIG. 1 illustrates a cross-sectional view of a plasma processing apparatus in accordance with an embodiment of the invention.

The semiconductor IC industry, driven by a demand for doubling circuit density every two years, has periodically reduced the minimum feature sizes of transistors and interconnects. Already, the generation of ICs commonly referred to as the 10 nm node uses less than 40 nm pitch for densely packed metal lines at the lower interconnect levels, and about 50 nm pitch for contacts to transistors. At these and smaller dimensions, the interconnect-RC delay of conventional copper (Cu) lines and tungsten (W) contacts may be limiting the speed of digital circuits. New materials are being introduced at the 10 nm nodes and below to replace dense Cu lines and W contacts. Ruthenium (Ru) metal is a leading candidate for replacing copper and tungsten in these and other applications. Similarly, Osmium (Os) is another metal similar to ruthenium and may also be a candidate for future applications. However, removing ruthenium using chemical mechanical polish (CMP) is difficult and expensive. It is, therefore, desirable to have a direct plasma etching technique to remove ruthenium/osmium, for example, to form Ru-lines with vertical edges, or to form Ru-plugs using direct etchback of Ru.

In order to be suitable for use in semiconductor manufacturing, a method for removing Ru/Os is expected to provide several characteristics: high etch rate with high selectivity to adjacent materials, high etch-uniformity across a substrate, low line edge roughness for anisotropic etch, and smooth top-surface for etchback, and controllable anisotropy for vertical edge profile without stringer defects. Such a method is currently not available with conventional processes. This disclosure describes embodiments of methods of etching thin films of conductive materials comprising elemental Ru and alloys of Ru with other metals using plasma processing.

The inventive features of the plasma etching methods described in this disclosure are able to achieve a more uniform etch rate across the entire region over which ruthenium/osmium is removed, reduced roughness of the new surface of ruthenium/osmium exposed by the etching process, and a higher etch selectivity (e.g., a high etch rate for Ru relative to the etch rates for other materials that may be exposed to the reactants during processing), as further described below. Although the embodiments describe selective removal of ruthenium/osmium deposited over a semiconductor wafer, it is understood that the same etch chemistry may be used to remove some other material (e.g., $RuO_2$), and films disposed over other surfaces (e.g., a clean process for removing films from the inner walls of a plasma processing chamber).

The methods provided by the embodiments of the invention may include a plasma-assisted etching process for removing Ru/Os, e.g., from an incoming semiconductor substrate having a Ru/Os layer, and a plasma processing apparatus in which the plasma-assisted etching process may be performed. The semiconductor substrate may have other layers of different materials in addition to the Ru/Os layer being processed, depending on the application where the Ru/Os layer is being used. The Ru/Os layer may be a layer of ruthenium, a layer of osmium, or a stack comprising Ru layer/Os layer. The plasma-assisted etching process is first described with an example set of process parameters and an example plasma processing apparatus illustrated in FIG. 1, in accordance with an embodiment of the invention. Several example embodiments of the plasma-assisted etching process applied to different device fabrication are described in greater detail with reference to FIGS. 2-7.

FIG. 1 illustrates a cross-sectional view of a plasma processing apparatus in accordance with an embodiment of the invention.

Referring to FIG. 1, a plasma processing apparatus 1000 is used to etch at least a portion of a metallic film, for example, a pure ruthenium layer, or an alloy of ruthenium with other metals, a pure osmium layer, or an alloy of osmium with other metals, or a combination thereof. The plasma processing apparatus 1000 includes a plasma processing chamber 150 in which the etching process may be performed.

The plasma processing chamber 150 comprises sidewalls 101, a base 106, and a top cover 104 that collectively substantially enclose, a plasma during operation, in the plasma processing chamber 150. The sidewalls 101, base 106, and top cover 104 may be made of a conductive material (e.g., stainless steel or aluminum) coated with a film such as yttria (e.g., $Y_xO_y$ or $Y_xO_yF_z$) except for a dielectric window 125 (e.g., a quartz window). In the example illustrated in FIG. 1, the dielectric window 125 may be a circular window spanning a major portion of the top cover 104 of a cylindrical plasma processing chamber 150.

A planar conductive coil 110 is disposed outside the plasma processing chamber 150 and adjacent to the dielectric window 125. Other electrical connections may be made to other components, as known to a person skilled in the art. For example, the chamber walls 101, 106, and 104 may be connected to a reference DC potential (e.g., ground potential), the (electrostatic) substrate holder 140 may be tapped (e.g., to connect to ground, a different DC bias, or an RF bias, or a combination of DC and RF bias), and sensors such as an optical emission spectroscopy (OES) sensor 143, a quadrupole mass spectrometer (QMS) 144, and a Langmuir probe (not shown) may be connected to external analyzers. The plasma processing chamber 150 and the planar coil 110 may be housed within an enclosure 145, which may be a Faraday cage or a solid enclosure.

A substrate holder 140 is disposed in the plasma processing apparatus 1000. In various embodiments, the substrate holder 140 may be a disc-shaped electrostatic holder located near the bottom of the plasma processing apparatus 1000.

A semiconductor substrate 141 (e.g., a semiconductor wafer) is placed over the substrate holder 140. The metal film, e.g., comprising Ru, to be processed inside a plasma processing chamber 150 of the plasma processing apparatus 1000 may be present on the semiconductor substrate 141.

The plasma source gases are introduced into the plasma processing chamber 150 by a gas input system, for example, the gas input system 105 illustrated in FIG. 1 by openings in the sidewalls 101. The gas input system 105 may include multiple inputs and may inject different gases into the plasma processing chamber 150 during processing. An opening in the base 106 is a gas outlet 115. A vacuum system (not shown) comprising exhaust pumps and control valves (e.g., throttle valve) may be connected to the gas outlet 115 to maintain a desired gas pressure and a gas flow between the gas input system 105 and the gas outlet 115. As known to a person skilled in the art, a control system comprising multiple sensors and controllers may be used to dynamically monitor and control the plasma process, for example, the constituency, flow-rates, temperature, and pressure of the gas mixture in the plasma processing chamber 150 as well as in the gas input system 105 and the gas outlet 115, respectively.

During processing, the plasma discharge in the plasma processing chamber 150 may be sustained by coupling RF power from the planar coil 110 configured appropriately by connecting its taps to respective nodes (e.g., to ground, to RF power sources, and impedance matching networks) of a suitable electrical circuit, as known to a person skilled in the art. The plasma parameters, such as ion and electron density and energy distributions, ratio of ion flux to radical flux, and the electric field in the sheath, may depend on the configuration of the planar coil 110 and the RF source frequency. For example, the planar coil 110 may be designed and configured as an RF resonator or as an RF element in a matching network. During processing, when the plasma processing apparatus is connected to a variable frequency RF power source (not shown), RF power may be inductively and/or capacitively coupled from the planar coil 110 to the plasma. In some applications, a high-density plasma sustained with a high RF source frequency (e.g., in the 13.56 MHz, 27.15 MHz, or 60 MHz band) may be used.

The plasma processing apparatus 1000 with a planar-coil 110 described herein is for example only; it is understood that other types of plasma sources could be used, for example, ECR, helicon, and microwave plasma sources.

A plasma pre-treatment of the plasma processing chamber 150 may be performed using, for example, hydrogen plasma and/or an oxygen plasma to substantially remove adsorbed halogens (e.g., $C_2$, $CF_4$, $CCl_4$, and the like) from the sidewalls 101, the base 106, and the top cover 104. In further embodiments, the plasma processing chamber 150 may be purged with a purge gas such as $N_2$ or Ar prior to forming a plasma discharge for processing. The plasma pre-treatment step and the purge step may reduce or eliminate the problems associated with halogens, as discussed further below. During processing, the process control system may use in situ sensors (e.g., OES sensor 143 and QMS sensor 144 in FIG. 1) for material analyses such as OES and QMS to detect and control the concentration of halogen atoms.

The mixture of gases introduced into the plasma processing chamber 150 by the gas input system 105 for the plasma discharge comprises a source of O atoms, a source of N atoms and typically a source of at least one of Ar, Kr, or Xe atoms (relatively heavy and stable atoms of group-VIIIA elements), in accordance with the embodiments in this disclosure. In the embodiments described in detail below, Ar gas has been used as one of the plasma source gases. In some other embodiments, the noble gases Kr (84 amu) and Xe (131 amu) may replace Ar, but at a higher cost.

In the embodiments described in this disclosure, mixtures of Ar, $O_2$, and $N_2$ gases in various proportions, as listed in Table I below, have been used as the plasma source gas. A direct plasma in contact with the semiconductor substrate 141 is generated and sustained in the plasma processing chamber 150 using power from an external RF power source (not shown) connected to the planar coil 110 of the plasma processing apparatus 1000. The oxygen (e.g., oxygen radicals (O*)) in the plasma may react with the Ru atoms at a portion of the surface exposed to the plasma to form the volatile oxides of Ru (e.g., $RuO_4$ and some $RuO_3$). The byproducts being highly volatile at the process conditions (e.g., temperature and pressure) may exit the plasma processing chamber 150 through the gas outlet 115 along with other exhaust gases, thereby providing the benefit of less frequent chamber cleaning to remove deposits from the sidewalls 101 and the dielectric window 125.

The processing parameters of the plasma etch process may be adjusted, in accordance with the values listed in Table I below in order to achieve a surface environment wherein Ru is removed primarily by chemical reactions instead of by physical sputtering. For example, the DC bias voltage and the RF bias power may be adjusted within respective ranges (listed in Table I) to control the ion energies to not exceed a level at which substantial sputter etch of the exposed metal may occur. However, as discussed in detail further below, sufficient bias may be provided to bombard the exposed surface with ions (e.g., argon ions $Ar^+$) to cause some surface damage. This enhances the Ru removal rate selectively from the damaged portion of the horizontal surface. In the example embodiment listed in Table I below, etching of Ru at room temperature has been achieved using a mixture of Ar, $O_2$, and $N_2$ plasma source gas. As illustrated in Table I, the etching of ruthenium can be achieved at lower temperature such as between 10° C. to 200° C., and in one embodiment between 10° C. and 50° C.

TABLE I

| Plasma Source Gas $Ar/O_2/N_2$ mixture | Minimum | Maximum | Example Embodiment |
|---|---|---|---|
| Ar (by volume) | 0% | 45% | 16% |
| $O_2$ (by volume) | 50% | 85% | 53% |
| $N_2$ (by volume) | 15% | 35% | 32% |
| Ar flow rate | 0 sccm | 150 sccm | 53 sccm |
| $O_2$ flow rate | 50 sccm | 300 sccm | 175 sccm |
| $N_2$ flow rate | 50 sccm | 120 sccm | 105 sccm |
| Chamber Pressure | 10 mTorr | 500 mTorr | 50 mTorr |
| Wafer Temperature | 10° C. | 200° C. | 40° C. |
| RF source power | 1 kW | 3 kW | 2.5 kW |
| RF source frequency | 13 MHz | 5000 MHz | 2540 MHz |
| RF bias power | 0 kW | 0.2 kW | 0.1 kW |
| RF bias frequency | 2 MHz | 15 MHz | 2 MHz |

Several advantages provided by adding a small amount of $N_2$ in the plasma source gas mixture of $Ar/O_2/N_2$ have been observed by the inventors of this application, as described below.

For example, a significant increase in the Ru removal rate is achieved when $N_2$ is added to a plasma source gas mixture of Ar and $O_2$. In one example, ruthenium does not etch when the ratio of the number of nitrogen to oxygen atoms (N:O) in the plasma is 0:1, but will proceed to etch at a non-zero etch rate, e.g., in one test at 5.4 nm/min, when the ratio is increased to 0.3:1 by adding nitrogen. Thus, an empirical correlation between the amount of N and the number of O* has been observed at low levels of nitrogen. Accordingly, in various embodiments, as the ratio of the flow rate of nitrogen to the flow rate of oxygen is increased, the ruthenium etch rate also increases.

A halogen additive (e.g., $Cl_2$, $CCl_4$, $CF_4$, or the like) may also provide an equivalent (or even higher) increase in the Ru etch rate, but the etch process may not be as controllable as etching Ru using $Ar/N_2/O_2$ plasma. For example, the $Ar/N_2/O_2$ plasma etch may provide a more uniform Ru etch rate between the center and edge of a semiconductor substrate. In one example embodiment, a center-to-edge etch rate ratio of about 1.1 may be achieved which compares favorably to a ratio of about 2 or more seen typically in Ru plasma etching processes using halogens.

Furthermore, the Ru-etch process using $Ar/N_2/O_2$ plasma provides the benefit of higher etch selectivity. The ratio of the etch rate of Ru to the etch rate of other materials used to form adjacent layers may be substantially increased by eliminating the highly reactive halogen ions and radicals from the plasma discharge. For example, a ratio of 75:1 may be achieved with respect to $SiO_2$, a typical hard mask material. A high selectivity to underlying layers is also advantageous, particularly for applications where Ru is used as a capping layer or as an electrode of storage elements such as a ferroelectric random access memory (FRAM) capacitor, or a dynamic RAM (DRAM) capacitor, or a magnetic tunnel junction (MTJ) of a magnetic RAM (MRAM). In such applications, a highly selective Ru-etch process provides improved edge profiles by reducing undesirable gouging and undercutting. For example, the selectivity between Ru and TaN, $SiO_2$, and $Si_3N_4$ may be at least 5:1, 5:1, and 5:1, respectively, so long as the etch process is not dominated by a physical etch mechanism.

The presence of nitrogen in the plasma discharges used to etch Ru provides smooth etched surfaces, including horizontal and vertical surfaces. Substantially smoother etched surfaces of Ru have been achieved using $Ar/N_2/O_2$ plasma in comparison to surfaces of Ru etched using plasma containing halogens, such as $Ar/C_2/O_2$ plasma. Such a reduction in surface roughness is an unusual and unexpected effect of having nitrogen in the gas mixture discovered by the inventors. One advantage of forming smoother surfaces of a narrow conductor is that its conductance may be enhanced by reducing surface-roughness scattering of electrons. Another advantage of reduced line edge roughness of narrow metal lines is reduction in random resistance variations due to random linewidth variations. Furthermore, the asperities of rough metal edges cause high localized electric fields and may thereby degrade the time-dependent dielectric breakdown (TDDB) lifetime of the dielectric between closely spaced Ru interconnect lines and/or contacts.

An increased Ru removal rate may also be achieved by bombarding the Ru surface with ions (e.g., $Ar^+$ ions), as mentioned above. In some embodiments, the etch rate of Ru over a flat horizontal surface may be increased by applying an external negative DC bias. The $Ar^+$ ions in the plasma are accelerated towards the substrate by a vertical electric field in the sheath region. The strength of the vertical electric field may be adjusted by an RF bias power supplied substrate holder 140. The Ar+ ions, being relatively massive (40 amu), may damage an exposed top surface of Ru, even for energies too low to cause significant Ru sputtering. A lighter noble gas (e.g., He and Ne) may not provide the desired effect of damage-induced increase in ruthenium etch rate. The temperature dependence of the Ru etch rate suggests that Ru is chemically removed, and that physically damaging the Ru surface enhances its reactivity with oxygen radicals ($O^*$). One advantage of using a group-VIIIA element is that it is chemically inert, hence no additional compounds are formed as byproducts of the etch process. Also, the damage-induced increase in the etch rate by $Ar^+$ bombardment facilitates anisotropic etching of Ru films; for example, in a reactive ion etch (RIE) process for etching Ru.

The embodiments described in this disclosure provide a method to etch Ru with an $Ar/N_2/O_2$ plasma, primarily by reacting Ru with $O^*$ to form volatile byproducts, mainly $RuO_4$ and some $RuO_3$. The method provides several advantages such as smoother etched surfaces and more uniform etch rates which are advantageous in fabricating conductive structures used in semiconductor devices and interconnects.

The embodiments of Ru-etch processes listed in Table I above may provide the characteristics (listed in Table II below). For example, the etch rate of Ru may be adjustable between about 5 nm/min to about 25 nm/min. The etch processes may remove ruthenium with a high selectivity to other materials, for example, etch selectivity in the range of 5 to 200 with respect to TiN, TaN, or $SiO_2$. Undesired variations in electrical parameters (e.g., resistance of narrow interconnect elements) may be improved by the low roughness of surfaces etched using these processes. For example, low RMS values of about 0.5 nm for line edge roughness and 0.1 nm for horizontal surface roughness may be achieved using the embodiments in this disclosure. In addition, the etch process parameters may be adjusted to provide isotropic as well as anisotropic etches that have well controlled edge profiles. For example, the taper angle of Ru edges may be varied between about 85° and 91°.

It may, thus, be possible to provide plasma-assisted Ru-etch processes which meet the requirements for use in semiconductor manufacturing, as discussed above. By adjusting the process parameters of the $Ar/N_2/O_2$ plasma Ru-etch process (e.g., the parameters listed in Table I) a person skilled in the art may design combinations of parameters to obtain the result of etch recipes to etch Ru and Ru-metal alloys with high etch-rate, high selectivity, good center-to-edge uniformity, low line edge roughness, and horizontal surface roughness, and controllable edge profiles from isotropic etching to vertical etching.

TABLE II

|  | Minimum | Maximum |
| --- | --- | --- |
| Etch Rate for Ru | 5 nm/min | 25 nm/min |
| Etch Selectivity w.r.t. TaN, TiN, or SiO2 | 5 | 200 |
| Center-to-edge etch rate ratio | 0.85 | 1.15 |
| Line-edge Roughness | 0.5 nm | 2 nm |
| Horizontal Surface Roughness | 0.1 nm | 1 nm |
| Edge Taper Angle for RIE | 85° | 91° |

As mentioned above, the advantages provided by the material properties of Ru may be applied in several applications in order to improve the performance of integrated circuits. Such applications are described with reference to FIGS. 2 through 7. Additionally, the process conditions previously described may also be used to clean the process chamber 150 after etching a substrate containing Ru.

FIGS. 2A-2D illustrate cross-sectional views of several intermediate steps in a fabrication process flow that may be used to form Ru interconnect lines. In this example, the Ru lines are at a first interconnect level formed directly above a contact level, for example, contacts 35 used to connect gates 10 of a FinFET. The interconnect lines at this level are generally short, and narrow lines are preferred to increase circuit density. As is known to a person skilled in the art, the narrow-width effect (of resistance) is a problem when scaling conventional metal lines along the width. For example, the resistance of narrow metal lines may increase with reducing width if a liner comprising relatively resistive metals (e.g., Ti, or Ta, or their nitrides, or combinations thereof) is used as an adhesion layer or as a diffusion barrier layer to prevent a core metal such as Cu from diffusing into the surrounding dielectric. The low diffusivity of Ru in $SiO_2$ may eliminate the necessity of a barrier metal encapsulating a Ru core. Also, the resistance increase with decreasing metal-width due to edge scattering is less severe in metals such as Ru which have a relatively low product of bulk resistivity and mean free path. In ruthenium, the product is about 70% of that of Cu. Accordingly, it may be advantageous to replace Cu with Ru to form narrow interconnect lines.

Figure 2A:
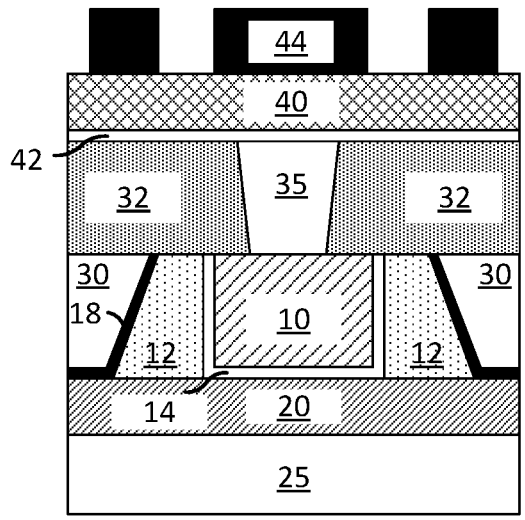
FIGS. 2A-2D illustrate cross-sectional views of direct-etch interconnect lines disposed between a damascene contact level and a dual-damascene interconnect level at various intermediate stages of fabrication, in accordance with an embodiment of the invention.

Referring now to FIG. 2A, a Ru film 40 having a thickness, for example, of about 40 nm to about 80 nm may be deposited using a suitable technique (e.g., CVD, ALD, magnetron sputtering, or the like) over two vertically adjacent interlayer dielectric (ILD) layers, referred to as ILD1 30 and ILD2 32, comprising insulators such as $SiO_2$ or a silicon oxide based low-k dielectric (e.g., porous oxides, fluorosilicate glass (FSG), and organosilicate glass (OSG)). Optionally, the bottom layer of ILD2 may be an etch-stop layer (ESL) comprising a dielectric such as $Si_3N_4$, $SiO_xN_y$, SiC, or SiCN (not shown). In some applications, an optional conductive ESL 42 comprising, for example, TiN or TaN may be formed over the ILD2 32 before the Ru film 40 is deposited. A contact 35 inlaid in ILD2 32 is shown connected to a gate structure of a FinFET comprising a metal gate 10 (e.g., a multilayer metal stack comprising Ta, TaN, TiN, W, and the like, or a combination thereof) and a high-k gate dielectric 14 (e.g., $HfO_2$, or $Al_2O_3$) inlaid within a recess formed earlier between a pair of source/drain spacers 12 (e.g., $SiO_xN_y$ spacers). A source/drain contact etch-stop layer (CESL) 18 (e.g., a $Si_3N_4$ layer) is shown lining the bottom surface of ILD1 30. In FIG. 2A, the metal gate 10 and a gate dielectric 14 are a portion of the metal gate structure extending over a shallow trench isolation (STI) region 20 in recesses between semiconductor fins formed earlier, for example, by etching a semiconductor substrate 25 (e.g. a bulk crystalline Si wafer). The semiconductor fins are not visible, being located along planes parallel to the plane of the cross-sectional views in FIG. 2. A patterned masking layer 44 may be formed over the Ru film. The patterned masking layer 44 may comprise dielectrics such as $SiO_2$, and $Si_3N_4$, or conductive materials such as TaN, Ti, and TiN, or a combination thereof that can provide etch selectivity with respect to Ru. The thickness of the patterned masking layer 44 used may vary in accordance with the etch selectivity with respect to Ru and the target thickness of Ru to be removed.

Figure 2B:
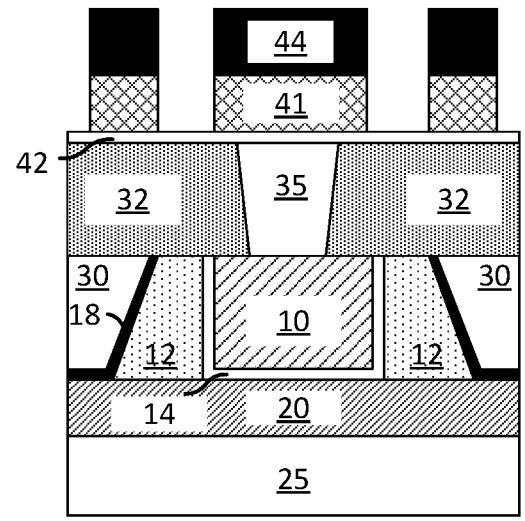
Figure 2C:
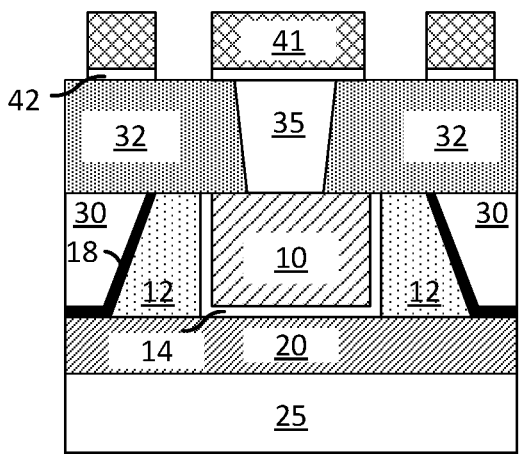

In FIG. 2B, the wafer in FIG. 2A has been exposed to the $Ar/N_2/O_2$ plasma, e.g., as described in FIG. 1, and Ru is removed from a portion of the top surface of the Ru exposed by the openings in the patterned masking layer 44, in accordance with the embodiments of the Ru-etch process described above. The exposed Ru may be etched vertically till the underlying layer, for example, the conductive ESL 42 is exposed, thereby forming a patterned Ru film 41. The exposed portion of the conductive ESL 42 and the patterned masking layer 44 may be removed during subsequent processing steps, as illustrated in FIG. 2C. The remaining patterned Ru film 41 and conductive ESL 42 form the conductive lines of the respective interconnect level.

Figure 2D:
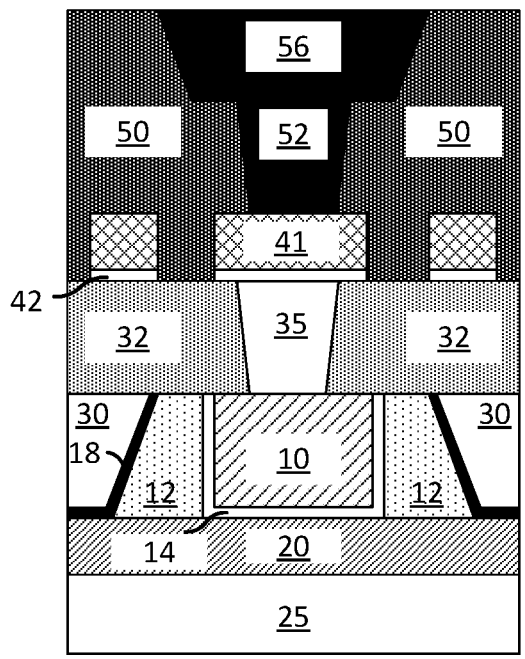

FIG. 2D illustrates the patterned Ru film 41 covered by an intermetal dielectric (IMD) layer 50, and the next interconnect level formed over the Ru level using, for example, a conventional Cu dual-damascene flow. The materials used to form IMD 50 may comprise insulators such as $SiO_2$ or a silicon oxide based low-k dielectric (e.g., porous oxides, fluorosilicate glass (FSG), and orthosilicate glass (OSG)), similar to ILD2 32. The copper via 52 in FIG. 2D connects the Cu line 56 to a portion of the patterned Ru film 41 disposed directly below the copper line 56. As known by a person skilled in the art, the dual-damascene flow comprises patterning openings (e.g., holes for copper vias 52 and trenches for copper lines 56) in the IMD 50 using a via-first or a trench-first patterning sequence, depositing a conformal barrier metal (e.g., TiN or TaN) liner, filling the openings with metal (e.g., using Cu electroplating), and removing all excess conductive material from the top surface of IMD 50 using a planarization process such as CMP, thereby forming the copper vias 52 and copper lines 56 inlaid in the IMD 50.

As discussed above, the reduced line edge roughness, improved etch rate uniformity, and higher etch selectivity relative to plasma Ru-etch processes using halogens are benefits provided by the described Ru-etch process when it is used in the method to form the Ru lines in FIG. 2.

As the width of patterned features such as metal lines scale below 100 nm, even small variations in the width result in appreciable variability in its line-resistance. A line with rough edges may be described as a line having random variations in width over a length of the order of the microscopic asperities on the surface. Line-edge roughness is a way to quantify this variation and usually refers to the width variation along just one edge of the feature. For example, the width of the line (W) is the average value of W, averaged over a long length, and the root mean square (RMS) value of the half-width W/2 is defined as the line edge roughness. Half-width is the distance of the edge from the longitudinal axis through the center of the line. Accordingly, in various embodiments, the line edge roughness of the lines 56 formed using the above process may be about 0.5 nm to about 2 nm. The inventors of this application have identified nitrogen as a key component to achieve such low line edge roughness.

The roughness of an etched horizontal surface (e.g., the horizontal surface of a Ru contact plug formed by a Ru etchback process) may be similarly quantified by a surface roughness, defined as the RMS variation of the surface locations relative to a perfectly smooth surface parallel to the rough surface. Accordingly, the surface roughness of the features may vary between 0.1 nm to about 1 nm.

One additional advantage of forming the Ru interconnect level using the direct-etch method, as illustrated in FIG. 2, is that a direct Ru-etch avoids using a Ru metal CMP step which is difficult and expensive to perform.

Another application of the Ru-etch process as described with reference to FIG. 3 is in the formation of Ru contacts and vias using plasma etchback of ruthenium. In conventional multilevel interconnect systems, tungsten and copper are used as the fill-material to fill openings for contacts and vias, respectively. As mentioned earlier, the advantage of using ruthenium is that its product of bulk resistivity times the mean free path is lower than that in either copper or in tungsten. At room temperature, the product in ruthenium is about 70% of that in copper and about 60% of that in tungsten. Furthermore, relatively resistive liners (e.g., TiN thin films), which are generally used as an adhesive layer for tungsten and as a diffusion barrier for copper, may not need to be used in contacts/vias formed using ruthenium.

Figure 3A:
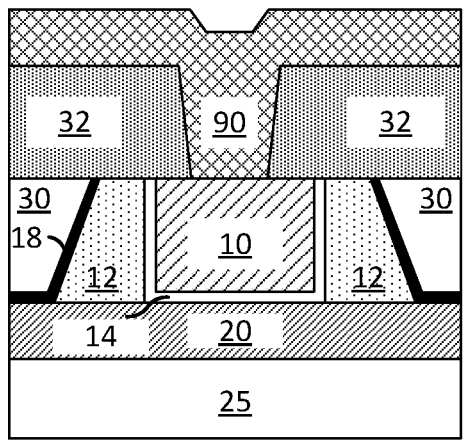
FIG. 3A-3C illustrate cross-sectional views of a direct-etchback contact connecting a conductive gate to a metal line at various intermediate stages of fabrication, in accordance with an embodiment of the invention.
Figure 3B:
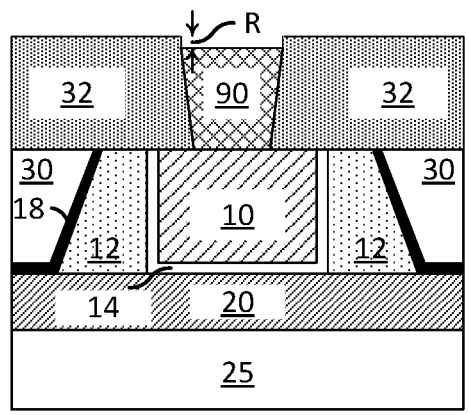
Figure 3C:
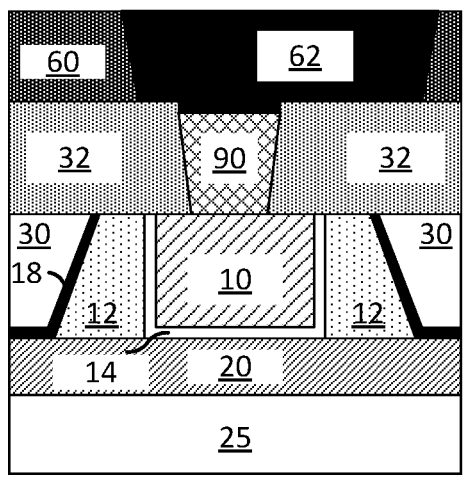

FIGS. 3A-3C illustrate cross-sectional views of several intermediate steps in a fabrication process flow that may be used to form an example Ru contact to make an electrical connection to a metal gate 10 of a FinFET metal gate structure extending over a STI region 20, similar to the metal gate structure described above with reference to FIG. 2. This embodiment advantageously avoids a planarization process such as chemical mechanical planarization because ruthenium containing layers are difficult to planarize.

FIG. 3A illustrates a Ru layer 90 formed over ILD2 32 filling a contact opening extending through ILD2 32 and making physical contact with a portion of the top surface of the metal gate 10. In various embodiments, as an example, the diameter of the contact opening may be about 15 nm to about 40 nm and the thickness of the ILD2 32 (also the height of the contact opening prior to Ru deposition) may be about 20 nm to about 80 nm. The ratio of the thickness of the excess metal over the flat top surface of ILD2 32 to the thickness of the Ru in contact with the top surface of the metal gate 10 may be about 1:2 to about 1:5.

As next illustrated in FIG. 3B, the excess metal over the top surface of ILD2 32 is removed using the Ru-etch process described in various embodiments, e.g., as described in FIG.

1. The Ru-etch process is applied in an etchback step, which may selectively remove the excess ruthenium to form a top surface comprising two surfaces. A first surface of the insulating ILD2 layer 32 and a second surface of the conductive Ru plug 90 inlaid in the ILD2 layer 32, as illustrated in FIG. 3B, are thus formed. The conductive Ru plugs 90 are formed preferably with minimal recess (R) to preserve the integrity and performance of the contact structure while, simultaneously, minimizing the defect density of Ru residue over the insulating top surface of ILD2. In some embodiments, a small recess R of about 0.5 nm to 10 nm may be achieved using the embodiments of the Ru-etch described in this disclosure. The etch properties of etch rate uniformity, smooth top surface, and high selectivity of the Ru-etch process help in achieving these objectives.

FIG. 3C illustrates an interconnect level (e.g., a Cu interconnect level) formed vertically adjacent above the contact level. In the example in FIG. 3C, a metal line 62 inlaid in IMD 60 is shown directly above the metal gate 10, and the contact plug 90 forms a physical and electrical connection between the two. The dielectrics used for IMD 60 may be same as those used for ILD2 32. In some other application the upper interconnect element may be a via instead of the line 62.

It is understood by a person skilled in the art that the flows described in FIGS. 2 and 3 may be modified and combined to form interconnect elements comprising integrated ruthenium structures for both contacts and vertically adjacent lines. For example, a patterned hardmask, similar to the patterned masking layer 44 (see FIG. 2) may be used to form an integrated ruthenium contact and line structure.

FIG. 4, which includes FIGS. 4A-4D, illustrates an example application where ruthenium is used as a masking layer to selectively etch other materials from underlying layers, for example, etch several dielectric layers to form high aspect ratio openings for supervias.

Figure 4A:
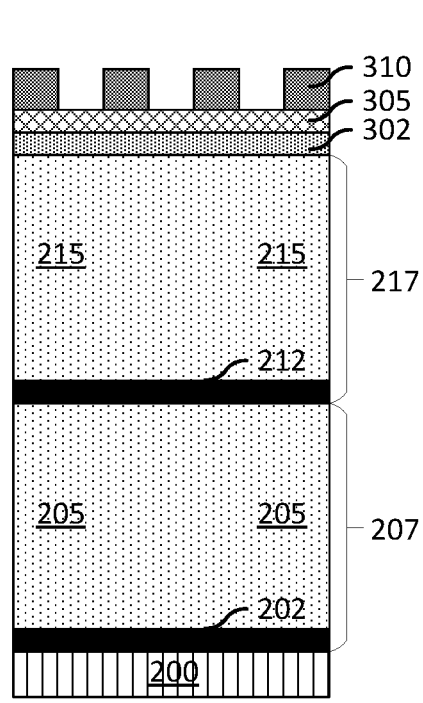
FIGS. 4A-4D illustrate cross-sectional views of a super-via opening through three successive levels of intermetal dielectric layers at various intermediate stages of fabrication, in accordance with an embodiment of the invention.

In FIG. 4A a patterned hardmask layer 310 is formed over a Ru layer 305. Underlying the Ru layer 305 a capping layer 302 comprising, for example, $SiO_2$ is shown. In this example, the capping layer 302 is shown formed over two IMD layers, a first IMD (IMD1) layer 207 and a second IMD (IMD2) layer 217, and an interconnect line (e.g., a Cu line) 200 is shown below IMD1 layer 207. The IMD1 layer 207 may comprise a main low-k dielectric layer 205 and a dielectric ESL and barrier layer 202, using the same materials as used for ILD2 layer 32 (described with reference to FIG. 2A). The IMD2 layer 217 may, likewise, comprise a main low-k dielectric layer 215 and a dielectric ESL and barrier layer 212. The thicknesses of the masking layer 310 and the capping layer 302 depend on the etch selectivity of the respective material and the thickness of the Ru layer 305.

Figure 4B:
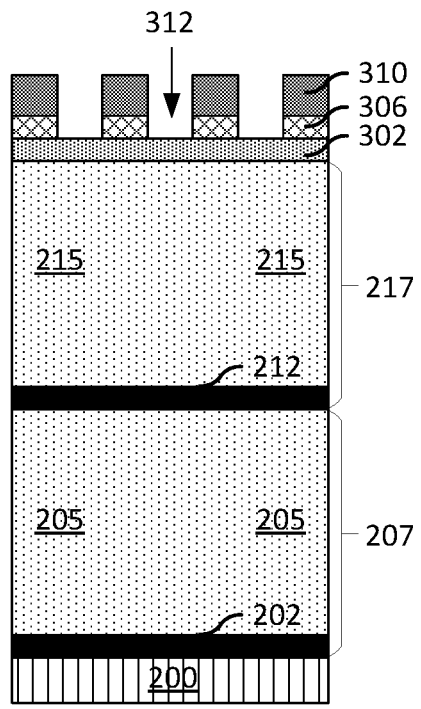

The Ru-etch process, e.g., as described in FIG. 1, is applied to form the patterned Ru layer 306 as illustrated in FIG. 4B. In this example, a selective number of openings between a pair of adjacent Ru features in the patterned Ru layer 305 are shaped as holes with appropriate dimensions to form supervias, for example, hole 312. Using the Ru surrounding the hole 312 as an etch mask in a subsequent etch process, the hole 312 may be extended through the portion of the capping layer 302 exposed by the hole 312 as well portions of the IMD2 layer 217 and IMD1 layer 207 directly below to expose a portion of the Cu line 200. The thickness of the Ru layer 305 depends on the materials and thicknesses of the layers to be etched using ruthenium as the masking layer.

Figure 4C:
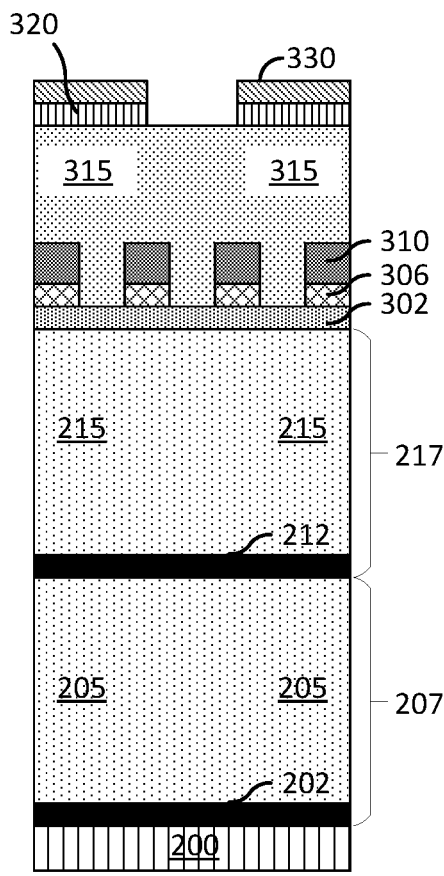

As illustrated in FIG. 4C, in this example, a patterning layer 315 such as an organic planarizing layer or spin-on carbon layer is formed over the capping layer 302 and covers the patterned Ru layer 305 and the hardmask layer 310. A patterned mask comprising a masking layer 320 (e.g., Si anti-reflective-coating (SiARC) or spin-on glass) and photoresist layer 330 is shown formed over the patterning layer 315.

Figure 4D:
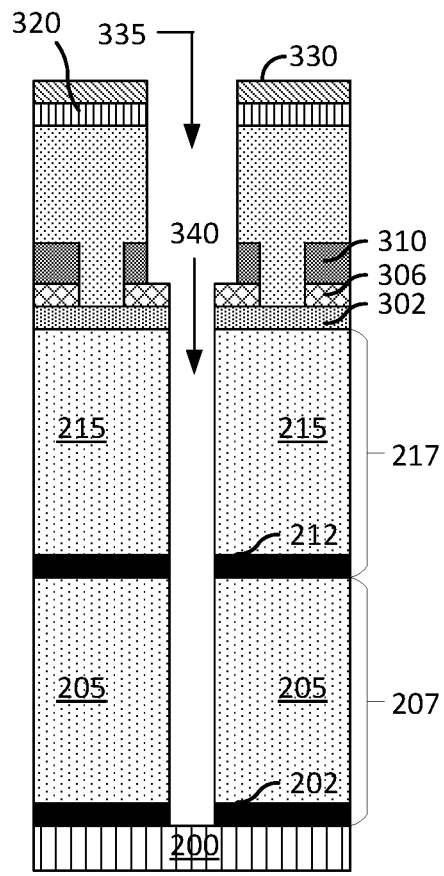

In FIG. 4D, openings 335 (e.g., holes) are formed in the patterning 315 using a suitable anisotropic etch, for example, RIE with F-chemistry (e.g., plasma $CF_4$, $SF_6$, or $NF_3$, or the like). Each opening 335 extends through the patterning layer 315 and the patterned hardmask layer 310 to expose the top surface of a portion of a pair of adjacent Ru features in the patterned Ru layer 305. The space between the pair of adjacent Ru features inside the opening 335 is same as the hole 312 formed during the earlier process step illustrated in FIG. 4B.

As illustrated in FIG. 4D, the exposed Ru inside the opening 335 forms a hardmask as the etch process proceeds to form a high aspect ratio supervia opening 340 extending vertically through multiple dielectric layers to expose a portion of the top surface of Cu line 200.

The diameter of the supervia opening 340 may be about 15 nm to about 50 nm in one embodiment, and the aspect ratio may be about 10 to about 50 in one embodiment. As appreciated by a person skilled in the art, random variations in the supervia size result from the line edge roughness in the patterned hardmask used to form the supervia opening. Thus, the reduced line edge roughness provided by the Ru-etch process used to pattern the Ru layer 305 reduces the size variations of the high aspect ratio supervia openings 340. In some other applications, the Ru-hardmask may be a sacrificial film and may be removed by a subsequent Ru-etch step. In order to maintain the integrity of the structures formed using ruthenium as a hardmask it would be advantageous to remove the Ru hardmask using a highly selective Ru-etch. The high etch selectivity provided by the Ru-etch may thus be advantageously used to remove a sacrificial Ru hardmask layer in an embodiment.

FIG. 5, which includes FIGS. 5A-5D, illustrates an example of applications wherein Ru may be used as a top/capping electrode and/or a bottom electrode of the storage elements in a memory array, for example, a ferroelectric random access memory (FRAM) capacitor, or a dynamic RAM (DRAM) capacitor, or a magnetic tunnel junction (MTJ) of a magnetic RAM (MRAM). Examples of a ferroelectric dielectric include Zr-doped $HfO_2$ and $Pb[Zr_xTi_{1-x}]O_3$ (PZT). Ferroelectric dielectrics as well as other high-k dielectrics such as $HfO_2$ and $Al_2O_3$ may be used in a DRAM capacitor. An MTJ stack may comprise an anti-ferromagnetic pinning layer disposed below a pinned first magnetic layer over which there is a second free magnetic layer separated from the pinned first magnetic layer by a tunnel barrier dielectric layer. Examples of materials used in an MTJ stack include, for example, PtMn, IrMn, or Rh—Mn in the pinning layer. A multilayered synthetic anti-ferromagnetic (SyAF) layer may also be used as the pinning layer. The magnetic layers (e.g., the pinned layer and the free magnetic layer) may be alloys comprising ferromagnetic metals such as iron, cobalt, and nickel, for example, $(CoFe)_xB_{1-x}$, $Fe_xB_{1-x}$, or $Fe_xNi_{1-x}$. Examples of the tunnel barrier dielectric layer include thin layer of MgO or $Al_xO_y$.

In the example processing sequence described with reference to the cross-sectional views illustrated in FIGS. 5A-5D, a stack of layers used in a memory storage element 89 comprising a patterned memory stack 76 shown sandwiched between two conductive electrodes, a top/cap electrode (in this example a Ru top/cap electrode) 77 and a bottom electrode 73. The storage element 89 may be a capacitor or an MTJ and the memory array may be a FRAM, DRAM, or MRAM array formed between two interconnect layers. The patterned memory stack 76 may comprise several dielectric layers, such as the capacitor dielectric or the tunnel barrier dielectric, and conductive layers, such as the magnetic layers of an MTJ or a capacitor electrode below the conductive capping layer. A bottom-electrode via 68 connects the bottom electrode 73 of the storage element 89 to a signal line or a power supply line of the memory array, which in this example may be a Cu line 63 of a lower interconnect level. In some other applications, the bottom electrode may be connected to some other conductive element, for example, connected to a metal gate structure using a contact. In this example, the top cap-electrode 77 is connected to the memory array using a Cu via 82 and a Cu line 86 of an upper interconnect level, for example, a dual-damascene Cu-interconnect level.

Figure 5A:
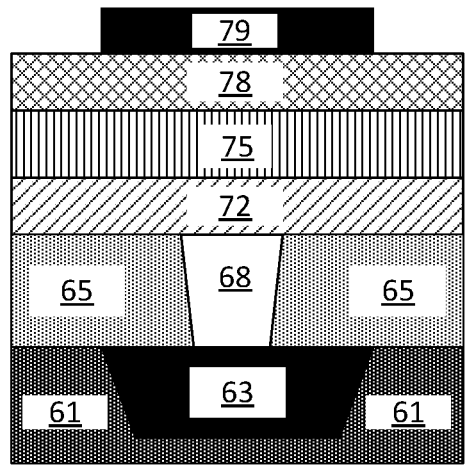
FIGS. 5A-5D illustrate cross-sectional views of storage element of a semiconductor memory disposed between two successive dual-damascene interconnect levels at various intermediate stages of fabrication, in accordance with an embodiment of the invention.

Referring now to FIG. 5A, a Cu line 63 inlaid in a lower IMD layer 61 (similar to the IMD layer 60 and Cu line 62 in FIG. 3C) is connected to a bottom-electrode via 68 (e.g., a Cu via) inlaid in a first insulating layer 65 comprising one or more dielectrics (e.g., $SiO_2$, $Si_3N_4$, or the like). A bottom electrode layer 72, a memory stack layer 75, and a Ru top-cap electrode layer 78 are formed successively over the first insulating layer 65 and the bottom-electrode via 68. A sacrificial patterned hardmask layer 79 (similar to the patterned masking layer 44 described with reference to FIG. 2) is shown formed over the Ru top-cap electrode layer 78.

Figure 5B:
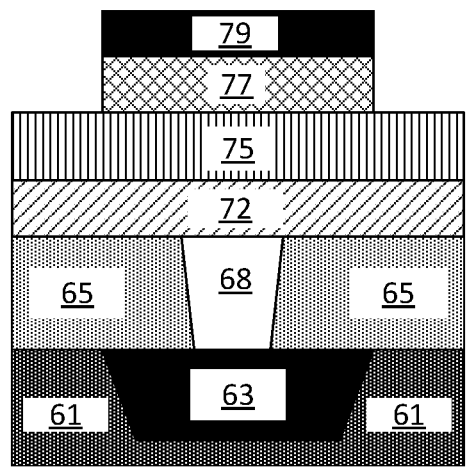

In FIG. 5B, the Ru top-cap electrode layer 78 has been patterned to form the Ru top-cap electrode 77 using the patterned hardmask layer 79. It is desirable to form the Ru top-cap electrode 77 without causing undesirable recess or undercutting of the memory stack layer 75. Advantageously, the Ru-etch process as described in the present application in various embodiments, e.g., in FIG. 1, is applied to remove the exposed ruthenium because of the high etch selectivity provided by this process. In addition, the superior etch-uniformity and reduced line edge roughness may improve reliability and reduce variability. In addition, not using halogen chemistry during the plasma etching avoids damaging sensitive layers of the memory stack layer 75.

Figure 5C:
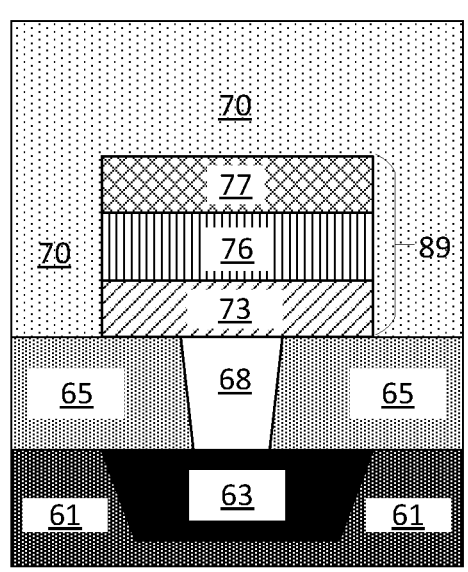

As illustrated in FIG. 5C, the memory stack layer 75 and bottom electrode layer 72 may be patterned by using the previously formed Ru top-cap electrode 77 as a patterned masking layer during a multi-step anisotropic etch process to complete etching the remaining layers of the storage element 89. Accordingly, the top electrode 77, the patterned memory stack 76 and the patterned bottom electrode 73 are formed self-aligned to each other. Protective sidewalls (not shown) may be formed along the opposing vertical sides of the storage element 89. A second insulating layer 70, similar to the first insulating layer 65, is deposited and is shown encasing the storage element 89.

Figure 5D:
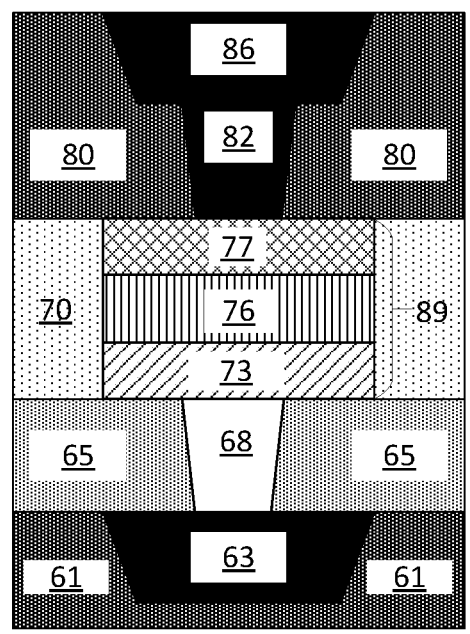

As illustrated in FIG. 5D, the second insulating layer 70 may be planarized and recessed to expose a top surface of the Ru top-cap electrode 77 substantially coplanar with a top surface of the second insulating layer 70 using any suitable process (e.g., CMP or resist etchback). FIG. 5D also illustrates the upper interconnect level comprising Cu vias 82 and Cu lines 86 formed vertically adjacent to the memory storage element 89 using, for example, the dual-damascene method. In the dual damascene method, an IMD layer is deposited, holes for vias and trenches for lines are formed by patterning the IMD using either a via-first or a via-last patterning sequence, the openings in the IMD are lined by barrier metals (e.g., TiN) and filled by depositing fill-metal such as copper using a suitable technique (e.g., electroplating), and excess metal is removed from over the surface of the IMD using a planarizing technique (e.g., CMP), thereby forming the conductive interconnect elements of the respective interconnect inlaid in the IMD. In FIG. 5D, the Cu via 82 forms an electrical connection between the Ru top-cap electrode 77 and the Cu line 86 of the upper interconnect level.

FIG. 6 illustrates a possible application of Ru-lines as conductive lines used as buried power distribution lines (e.g., $V_{cc}$ and $V_{ss}$ lines) in integrated circuits formed using a bulk semiconductor substrate. The advantage of using ruthenium for this application is that it can withstand the high temperature process steps such as source/drain anneal done at a temperature that may be about 900° C. to about 1100° C. without leaching out through thin barrier layers (e.g., thin $SiO_2$ barrier) into the surrounding material and without a change in morphology that increases the resistance of Ru lines. As in the prior embodiment described with respect to FIGS. 3A-3C, this embodiment advantageously avoids chemical mechanical planarization while achieving excellent height uniformity of the buried power distribution lines comprising ruthenium.

Figure 6A:
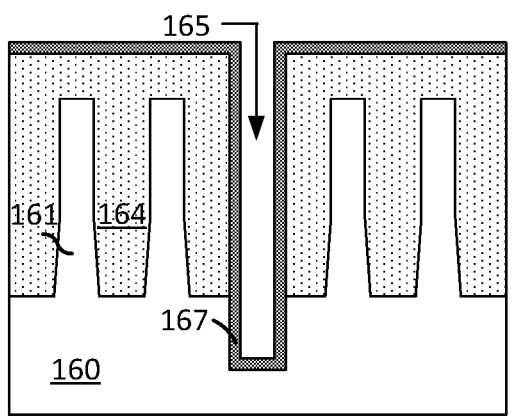
FIGS. 6A-6D illustrate cross-sectional views of a buried power rail at various intermediate stages of fabrication, in accordance with an embodiment of the invention.

As illustrated in FIG. 6A, semiconductor fins 161 are patterned by etching trenches in a bulk semiconductor substrate 160 (e.g., a bulk crystalline Si wafer). The openings are then filled by depositing an insulator (e.g., $SiO_2$) to form an isolation layer 164. The isolation layer 164 is then planarized using, for example, CM'. Then, a patterned masking layer (e.g., a photoresist layer or a hardmask) is used to form high aspect ratio trenches in a portion of the region between the fins 161 using, for example, RIE. The trenches extend through the isolation layer 164 and further into the semiconductor substrate 160 below. Then, a conformal, thin insulating liner layer 167 is deposited to form the openings 165, as illustrated in FIG. 6A. The buried power supply lines using Ru are formed embedded in the openings 165 during subsequent processing. The material used to form the liner layer 167 (e.g., PEALD/ALD $SiO_2$) is selected to provide a high etch selectivity during a process step in which the Ru-etch process may be used. The processing techniques to fabricate the structure illustrated in FIG. 6A are known to a person skilled in the art.

Figure 6B:
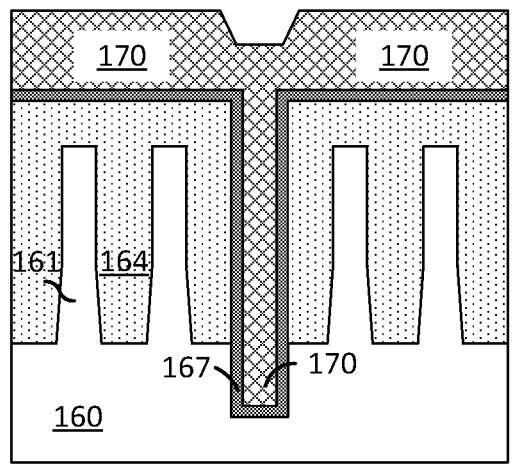

In FIG. 6B, a ruthenium layer 170 is deposited using, for example, CVD, ALD, or magnetron sputtering, to completely fill the openings 165. The ratio of the thickness of the Ru layer 170 in the region where openings 165 were formed to the thickness of the Ru layer 170 over a relatively large planar surface may be larger than unity, as illustrated in FIG. 6B. The ratio may be about 5:1 to about 20:1, depending on the width and aspect ratio of the openings 165.

Figure 6C:
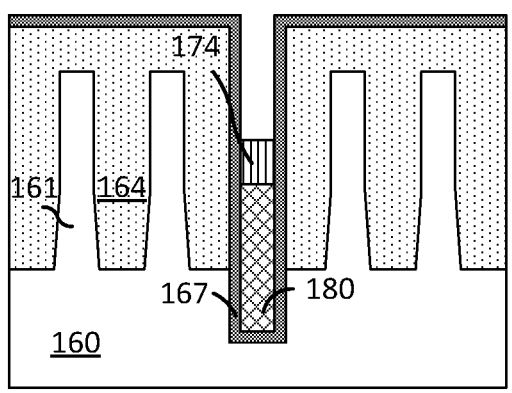

FIG. 6C illustrates a cross-sectional view of the structure in FIG. 6B after completing several process steps. The Ru layer 170 over the planar surface may be removed completely and the ruthenium surface recessed further, leaving a Ru buried layer 180 inside the trenches. Recessing the Ru layer 170 to form the Ru buried layer 180 may be accomplished using an etchback process, similar to the Ru-etchback described with reference to FIG. 3B using the Ru-etch process, e.g., the plasma etch process described in FIG. 1. After the Ru-etch process is complete, an insulating cap layer 174 (e.g., a $Si_3N_4$ layer) is deposited and etched back to form the insulating cap layer 174 over the Ru layer 170, as illustrated in FIG. 6C.

Figure 6D:
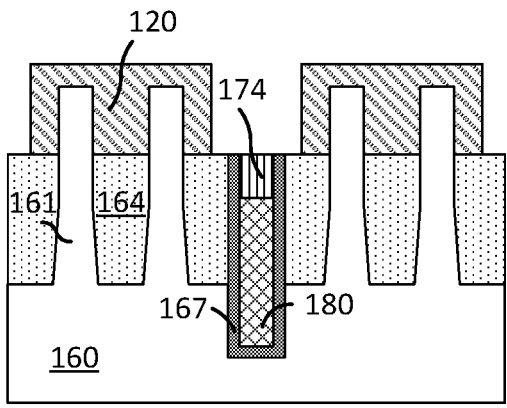

Referring now to FIG. 6D, the insulating layers covering an upper portion of the semiconductor fins 161 have been removed using a standard method used to form STI regions between fins, as known to a person skilled in the art. For example, first a CMP step may be used to remove material from over the fins 161 till the top surface of isolation layer 164 is substantially coplanar with the top surface of the fins 161. Then a recess etch may be performed to further recess the isolation layer 164 to expose an upper portion of the semiconductor fins 161. In this application, the process parameters of the isolation recess etch and the Ru-etchback described with reference to FIG. 6C are adjusted such that the top surface of the Ru buried layer 180 is below the top surface of the isolation oxide 164, as illustrated in FIG. 6D. In FIG. 6D, the top surfaces of the isolation layer 164, the liner layer 167, and the insulating cap layer 174 are formed substantially coplanar with each other. The Ru buried layer 180 in FIG. 6D form the Ru buried power lines. FIG. 6D also illustrates sacrificial gate structures 120 wrapping around the semiconductor fins 161. The sacrificial gate structures 120 are formed subsequent to forming the buried power line structures and are used to form metal gate structures for FinFETs in a replacement gate process flow.

The improved etch rate uniformity and the smoother top surfaces provided by the Ru-etch processes described in FIG. 1 are advantageous in reducing variability in line resistance of Ru buried power lines (e.g., the Ru buried layer 180 in FIGS. 6C and 6D). Furthermore, the use of a direct etch provides the cost advantage over a difficult and expensive Ru-CMP process.

Yet another application of the Ru-etch process in a Ru-etchback step used to form a dual-fill metal interconnect level, described using FIG. 7. This application provides the dual benefit of the lower resistance of narrow (linewidth less than about 20 nm) Ru-lines relative to Cu lines and the lower resistance of wide (linewidth greater than about 20 nm) Cu lines relative to Ru-lines. Similar to the embodiment of FIGS. 3A-3C, this embodiment avoids chemical mechanical planarization of ruthenium layers while achieving excellent height uniformity in the narrow lines.

Figure 7A:
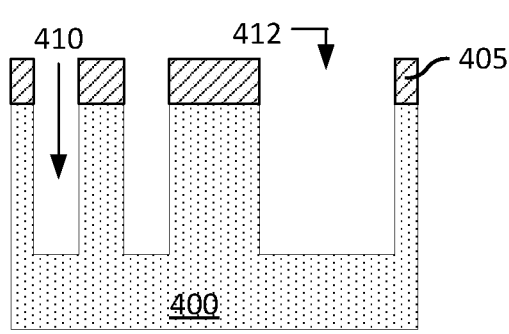
FIGS. 7A-7F illustrate cross-sectional views of a dual-fill metal interconnect level at various intermediate stages of fabrication, in accordance with an embodiment of the invention.

FIG. 7A illustrates trenches for interconnect lines formed in, for example, a low-k dielectric IMD layer 400 and a Si$_3$N$_4$ capping layer 405. The trenches 410 are openings for densely spaced, narrow interconnect lines and the wide trench 412 is for a wide interconnect line.

Figure 7B:
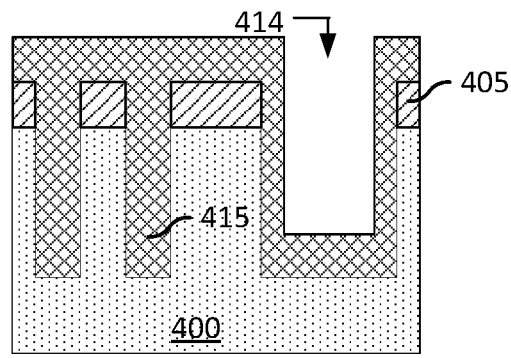

In FIG. 7B a Ru layer 415 has been deposited using a target thickness selected to completely fill the narrow trenches 410 while, simultaneously, partially filling wide trenches to leave a substantial opening 414, as illustrated by the partially filled trench at the right side of the FIG. 7B. The target thickness may be adjusted to achieve a Ru-superfill for all trenches narrower than a threshold width, for example, a threshold width of about 20 nm.

Figure 7C:
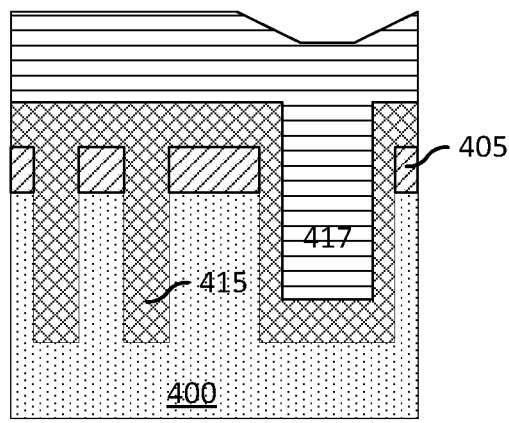

FIG. 7C illustrates the Ru top surface coated with a sacrificial layer 417 of flowable material, such as spin-on glass (SOG) or photoresist. The thickness of the flowable material deposited is sufficient to completely fill all the wide openings, such as the wide opening 414 in FIG. 7B.

Figure 7D:
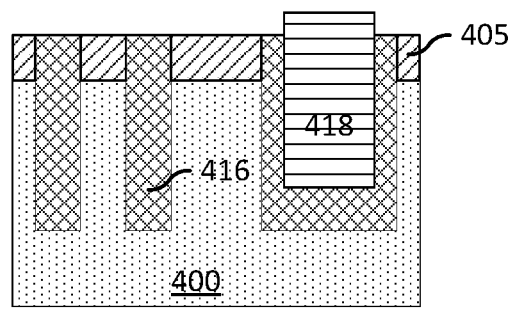

In FIG. 7D, an etchback of the flowable material of the sacrificial layer 417 (see FIG. 7C) has been performed first to recess the sacrificial layer 417 to form sacrificial insulating plugs 418 filling the openings 414. The resulting top surface (not shown) comprises a top surface of the sacrificial insulating plugs 418 substantially coplanar with a conductive top surface of the Ru layer 415.

Etchback of the sacrificial layer 417 is followed by a Ru etchback of the Ru layer 415 to remove excess ruthenium from over the capping layer 405 to form the recessed ruthenium layer 416 and a top surface comprising conductive and insulating regions, as illustrated in FIG. 7D. The etchback of the Ru layer 415 may be performed using the Ru-etch process described in various embodiments, for example, described using FIG. 1.

As illustrated in FIG. 7D, the recessed ruthenium layer 416 simultaneously forms narrow Ru-plugs (formed in the narrow trenches 410 in FIG. 7A) and conductive liners around the sacrificial insulating plugs 418 (formed in the wide trench 412 in FIG. 7A). The top surface of the structure illustrated in FIG. 7D comprises a conductive top surface of Ru substantially coplanar with an insulating top surface of the capping layer 405, and a top surface of the sacrificial insulating plugs 418 protruding above the top surface of the recessed ruthenium layer 416.

Figure 7E:
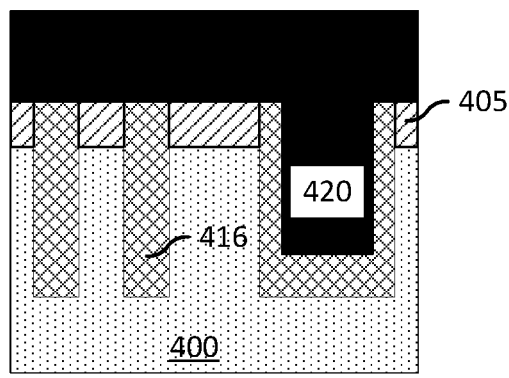

FIG. 7E shows a cross-sectional view of the structure after a suitable etch step (e.g. a wet etch or a dry etch) has been performed to remove the sacrificial insulating plugs 418 and the resulting openings have been completely filled by forming a conductive layer 420 comprising a metal, for example, Cu using, for example, electroplating deposition techniques.

Figure 7F:
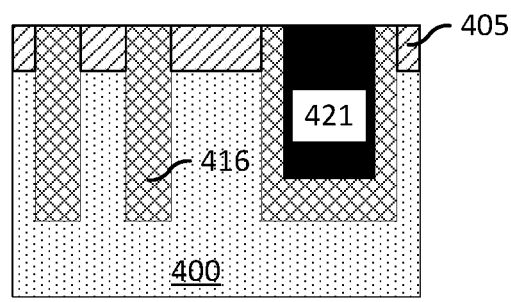

In FIG. 7F, the conductive layer 420 is recessed using, for example, a metal CMP to form the conductive plugs, for example, Cu-plugs 421.

The fabrication flow for a dual-metal interconnect level described above also benefits from the improved etch-uniformity, higher etch selectivity, and smoother surfaces provided by the Ru-etch process.

The Ru-etch process may also be utilized to clean a plasma chamber (similar to the plasma processing chamber 150). For example, after Ru deposition using, for example, magnetron sputtering is completed, the substrate (such as the substrate 141) may be removed and a subsequent plasma process to etch Ru may be utilized to remove Ru from the chamber walls (e.g., from the sidewalls 101 and the dielectric window 125 of the top cover 104).

Although embodiments of the present invention describe a ruthenium layer, they also apply equally to an osmium layer. In both cases, the ruthenium/osmium layer may comprise a pure metal layer or an alloy containing the elemental metal.

Example embodiments of the invention are summarized here. Other embodiments can also be understood from the entirety of the specification as well as the claims filed herein.

Example 1

A method of plasma processing includes maintaining a plasma processing chamber between 10° C. to 200° C.; flowing oxygen and nitrogen into the plasma processing chamber, where a ratio of a flow rate of the nitrogen to a flow rate of oxygen is between about 1:5 and about 1:1; and etching a ruthenium/osmium layer by sustaining a plasma in the plasma processing chamber.

Example 2

The method of example 1, where the ruthenium/osmium layer includes a layer of ruthenium.

Example 3

The method of one of examples 1 to 2, where etching the ruthenium/osmium layer includes: exposing a substrate disposed in the plasma processing chamber to the plasma, the substrate including the ruthenium/osmium layer, where the etching forms a feature.

Example 4

The method of one of examples 1 to 3, where the feature is a metal line disposed between the substrate and a copper metal line, where the metal line is narrower than the copper metal line.

Example 5

The method of one of examples 1 to 4, where the substrate includes an insulating layer on which the ruthenium/osmium layer is disposed, where, when forming the feature, the ruthenium/osmium layer is etched at a first rate and the insulating layer is etched at a second rate, where the first rate is faster than the second rate.

Example 6

The method of one of examples 1 to 3, 5, where the feature is a via including ruthenium/osmium, the via contacting a lower metal line or where the feature is a buried power rail including ruthenium/osmium and disposed in the substrate.

Example 7

The method of one of examples 1 to 3, where the feature is an electrode of a two terminal memory device.

Example 8

The method of one of examples 1 to 3, further including using the feature as an etch mask, forming an opening for a supervia extending through multiple levels of metallization.

Example 9

The method of one of examples 1 to 8, further including flowing argon with the oxygen and the nitrogen, where a ratio of a flow rate of the argon to a flow rate of oxygen is between about 0:1 and about 1:5.

Example 10

A method of plasma processing, the method including: maintaining a plasma processing chamber between 10° C. to 200° C.; flowing oxygen and nitrogen into the plasma processing chamber, where a ratio of a flow rate of the nitrogen to a flow rate of oxygen is between about 1:5 and about 1:1; and etching a ruthenium/osmium layer by sustaining a plasma in the plasma processing chamber.

Example 10

A method of plasma processing includes flowing oxygen and nitrogen into a plasma processing chamber; sustaining a plasma in the plasma processing chamber; exposing a substrate disposed in the plasma processing chamber to the plasma, the substrate including a ruthenium/osmium layer; and forming a feature by etching, at a first rate, the ruthenium/osmium layer, where a value of the first rate at a point at a center of the substrate to a value of the first rate at a point at an edge of the substrate varies between 0.85 to 1.15, and where a surface roughness of the ruthenium/osmium layer after the etching varies between 0.1 nm and 1 nm.

Example 11

The method of example 10, where a line edge roughness of the ruthenium/osmium layer after the etching is between 0.5 nm and 2 nm.

Example 12

The method of one of examples 10 or 11, where the feature is a metal line disposed between the substrate and a copper metal line, where the metal line is narrower than the copper metal line.

Example 13

The method of one of examples 10 to 12, where the substrate includes an insulating layer on which the ruthenium/osmium layer is disposed, where when forming the feature, the ruthenium/osmium layer is etched at a first rate and the insulating layer is etched at a second rate, where a ratio between the first rate and the second rate is between 5:1 to 200:1.

Example 14

The method of one of examples 10 to 11, further including: using the feature as a etch mask layer, forming an opening for a supervia extending through multiple levels of metallization.

Example 15

The method of one of examples 10 to 14, further including performing a process to substantially remove halogen from the plasma processing chamber.

Example 16

A method of forming a device includes depositing an insulating layer over a substrate, the insulating layer including a major outer surface; forming an opening in the insulating layer; depositing a first conductive material including ruthenium/osmium, the first conductive material covering the major outer surface and covering sidewalls of the opening; and using a plasma etching process, removing the first conductive material from the major outer surface leaving a remaining portion covering a portion of the sidewalls, where using the plasma etching process includes flowing oxygen and nitrogen into a plasma processing chamber.

Example 17

The method of example 16, further includes depositing a second conductive material to contact the remaining portion of the first conductive material remaining after the plasma etching process.

Example 18

The method of one of examples 16 or 17, where depositing the first conductive material overfills the opening, and where the second conductive material forms a metal line disposed in an upper metal level above the insulating layer.

Example 19

The method of one of examples 16 to 17, further including: before using the plasma etching process, depositing a sacrificial material to fill remaining portions of the opening after depositing the first conductive material; and planarizing the second conductive material.

Example 20

The method of one of examples 16 to 17, further including: depositing an insulating material to cap a remaining portion of the first conductive material remaining after the plasma etching process, where depositing the first conductive material overfills the opening, where the opening extends into the substrate through the insulating layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of plasma processing, the method comprising:
   maintaining a plasma processing chamber between 10° C. to 200° C.;
   flowing argon, oxygen and nitrogen into the plasma processing chamber without flowing a halogen-containing gas, wherein a flow rate ratio of a flow rate of the nitrogen to a flow rate of the oxygen is between about 1:5 and about 1:1;
   etching a ruthenium/osmium layer by a plasma generated in the plasma processing chamber only from a gas mixture consisting of the argon, the oxygen, and the nitrogen flowing through the plasma processing chamber at the flow rate ratio; and
   performing a plasma pre-treatment step to remove halogen from the plasma processing chamber before flowing the oxygen and the nitrogen.

2. The method of claim 1, wherein the ruthenium/osmium layer comprises a layer of ruthenium.

3. The method of claim 1, wherein etching the ruthenium/osmium layer comprises:
   exposing a substrate disposed in the plasma processing chamber to the plasma, the substrate comprising the ruthenium/osmium layer, wherein the etching forms a feature.

4. The method of claim 3, wherein the feature is a metal line disposed between the substrate and a copper metal line, wherein the metal line is narrower than the copper metal line.

5. The method of claim 3, wherein the substrate comprises an insulating layer on which the ruthenium/osmium layer is disposed on, wherein, when forming the feature, the ruthenium/osmium layer is etched at a first rate and the insulating layer is etched at a second rate, wherein the first rate is faster than the second rate.

6. The method of claim 3, wherein the feature is an electrode of a two terminal memory device.

7. The method of claim 3, further comprising using the feature as an etch mask, forming an opening for a supervia extending through multiple levels of metallization.

8. The method of claim 1, wherein a ratio of a flow rate of the argon to a flow rate of oxygen is between 0:1 and 1:5.

9. A method of plasma processing, the method comprising:
   flowing argon, oxygen and nitrogen into a plasma processing chamber, wherein a flow rate ratio of a flow rate of the nitrogen to a flow rate of the oxygen is between about 1:5 and about 1:1;
   sustaining a halogen-free plasma in the plasma processing chamber, the halogen-free plasma being generated only from a gas mixture consisting of argon, nitrogen, and oxygen flowing at the flow rate ratio;
   exposing a substrate disposed in the plasma processing chamber to the halogen-free plasma, the halogen-free plasma etching, at a first rate, a ruthenium/osmium layer in the substrate to form a feature; and
   wherein a value of the first rate at a point at a center of the substrate to a value of the first rate at a point at an edge of the substrate varies between 0.85 to 1.15, and wherein a surface roughness of the ruthenium/osmium layer after the etching varies between 0.1 nm and 1 nm, wherein the substrate comprises an insulating layer on which the ruthenium/osmium layer is disposed, wherein when forming the feature, the ruthenium/osmium layer is etched at a first rate and the insulating layer is etched at a second rate, wherein a ratio between the first rate and the second rate is between 5:1 to 200:1.

10. The method of claim 9, wherein a line edge roughness of the ruthenium/osmium layer after the etching is between 0.5 nm and 2 nm.

11. The method of claim 9, wherein the feature is a metal line disposed between the substrate and a copper metal line, wherein the metal line is narrower than the copper metal line.

12. The method of claim 9, further comprising:
   using the feature as a etch mask layer, forming an opening for a supervia extending through multiple levels of metallization.

* * * * *